United States Patent
Kinoshita et al.

(10) Patent No.: US 8,410,372 B2
(45) Date of Patent: Apr. 2, 2013

(54) WIRING BOARD, STACKED BATTERY DEVICE, AND VEHICLE HAVING STACKED BATTERY DEVICE

(75) Inventors: Takuya Kinoshita, Yokosuka (JP); Kenji Hosaka, Yokosuka (JP); Hajime Satou, Yokohama (JP); Osamu Shimamura, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 1468 days.

(21) Appl. No.: 11/984,731

(22) Filed: Nov. 21, 2007

(65) Prior Publication Data
US 2008/0179082 A1    Jul. 31, 2008

(30) Foreign Application Priority Data

Nov. 27, 2006  (JP) ................................ 2006-318779
Jun. 27, 2007  (JP) ................................ 2007-169562

(51) Int. Cl.
*H05K 1/03* (2006.01)
(52) U.S. Cl. ......... 174/255; 174/254; 174/256; 361/749
(58) Field of Classification Search .................. 174/255, 174/254; 361/748, 749
See application file for complete search history.

(56) References Cited

U.S. PATENT DOCUMENTS

| | | | | |
|---|---|---|---|---|
| 2,926,329 | A * | 2/1960 | Crane | 439/285 |
| 3,518,652 | A * | 6/1970 | Bass et al. | 340/870.02 |
| 4,879,190 | A * | 11/1989 | Lundsgaard | 429/94 |
| 5,590,465 | A * | 1/1997 | Santo | 29/884 |
| 5,598,627 | A * | 2/1997 | Saka et al. | 29/861 |
| 6,473,294 | B1 * | 10/2002 | Maier | 361/611 |
| 6,784,375 | B2 * | 8/2004 | Miyake et al. | 174/261 |
| 2003/0215678 | A1 * | 11/2003 | Barton et al. | 429/12 |
| 2004/0091771 | A1 * | 5/2004 | Hosaka et al. | 429/185 |
| 2006/0091891 | A1 | 5/2006 | Woo et al. | |

FOREIGN PATENT DOCUMENTS

| | | |
|---|---|---|
| JP | 2003-258421 A | 9/2003 |
| JP | 2005-235428 A | 9/2005 |

* cited by examiner

*Primary Examiner* — Tuan T Dinh
*Assistant Examiner* — Steven Sawyer
(74) *Attorney, Agent, or Firm* — Foley & Lardner LLP

(57) ABSTRACT

A wiring board to be inserted between collector foils of each unit cell in a stacked battery includes a comb-shaped insulating substrate and a wiring layer. The insulating substrate has a plurality of teeth and a rod, and the wiring layer is formed on the insulating substrate and includes a plurality of lead wires individually extending from a distal end of each of the plurality of teeth to an end of the rod to deliver a current of a potential across a conductive member being in contact with the distal ends of the teeth to the end of the rod.

11 Claims, 7 Drawing Sheets

FIG. 1A
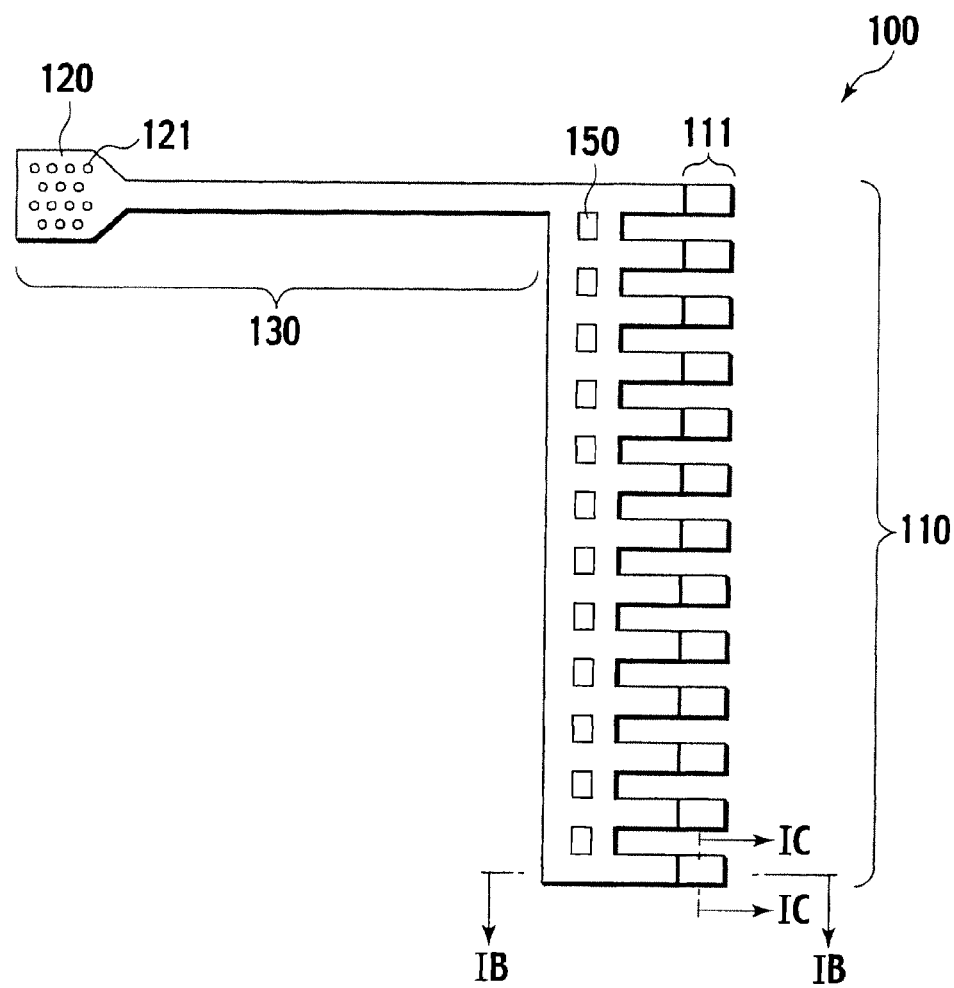
FIG. 1B
FIG. 1C
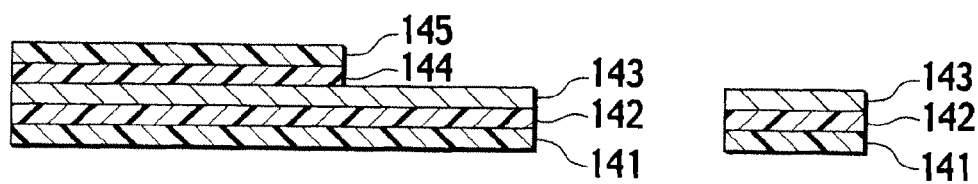

WIRING BOARD, STACKED BATTERY DEVICE, AND VEHICLE HAVING STACKED BATTERY DEVICE

BACKGROUND OF THE INVENTION

1. Field of the Invention

The present invention relates to a wiring board, a stacked battery device, and a vehicle having the stacked battery device. More particularly, the present invention relates to an integrally-formed wiring board, a stacked battery device with the wiring board mounted thereon, and a vehicle that incorporates the stacked battery device.

2. Description of the Related Art

In recent years, electric vehicles and hybrid powered automobiles have actively been developed in the automotive industry with an aim of protecting the environment.

Secondary batteries to be employed by automobiles are required to be capable of outputting a high power. Hence, stacked batteries each formed by stacking a plurality of secondary cells (hereinafter, each secondary cell is referred to as "unit cell") connected in series are employed.

As unit cells in a stacked battery differ from one another in internal resistance and capacity, in a state of being connected in series, the unit cells take different voltage shares. When the voltage shares vary, an excessive load is applied on a unit cell that takes a large voltage share. In such a state, the larger the voltage share taken by a unit cell, the more quickly the unit cell is degraded, resulting in that the unit cell that takes a large voltage share limits a usable life of the stacked battery.

To solve such a problem, it is desirable to measure the voltage shares taken by the unit cells and control the voltage shares based on a result of measurement, thereby equalizing all the voltage shares taken by the unit cells.

An invention that allows detection of a voltage of each unit cell; i.e., a voltage share, from the outside of a battery is described in Japanese Patent Application Laid-open No. 2005-235428. The invention described in Japanese Patent Application Laid-open No. 2005-235428 is specifically described below. Tabs are connected to a collector foil of each unit cell such that positions of the tabs differ from one unit cell to another. The plurality of unit cells and a wiring plate that includes contacts at positions corresponding to the tabs are stacked. The tabs are brought into contact with the corresponding contacts to derive an output voltage of each unit cell to the outside of the battery via the wiring board.

However, the invention described in Japanese Patent Application Laid-open No. 2005-235428 is disadvantageous in that, a separator, which is a constituent element of the unit cell, can be deformed when the tab (specifically, a metal plate or a metal foil) is inserted between layers in the battery for connecting the tabs with the collector foil. As the tab is formed of a metal plate or a metal foil, stress can concentrate on a connecting portion between the tab and the collector or that between the tab and the wiring board formed with a flexible substrate, inducing metal fatigue of the tab which can be caused by vibrations.

The present invention has been achieved to solve the above problems and is to provide a wiring board for battery control that allows monitoring of individual output voltages of unit cells while attaining a high reliability, a stacked battery device, and a vehicle having the stacked battery device.

SUMMARY OF THE INVENTION

A wiring board according to one aspect of the present invention includes a comb-shaped insulating substrate that has a plurality of teeth and a rod supporting the plurality of teeth, and a wiring layer formed on the insulating substrate and including a plurality of lead wires. Each lead wire individually extends from a distal end of a corresponding one of the plurality of teeth to an end of the rod to deliver a current of a voltage across a conductor, which is in contact with the distal ends of the plurality of teeth, to the end of the rod.

A stacked battery device according to one aspect of the present invention includes a plurality of opposing collector foil pairs and a comb-shaped wiring board. The comb-shaped wiring board has a plurality of teeth each inserted between one of the opposing collector foil pairs and electrically connected with either one of the opposing collector foil pair, and a rod connected with each of the plurality of teeth and provided with an output end through which potential values at the plurality of teeth are output.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodiments of the invention will be described with additional specificity and detail through use of the accompanying drawings in which:

FIGS. 1A to 1C are a top view and cross-sectional views of a wiring board formed with a flexible substrate according to a first embodiment of the present invention;

DETAILED DESCRIPTION OF THE PREFERRED EMBODIMENTS

Figure 2A:
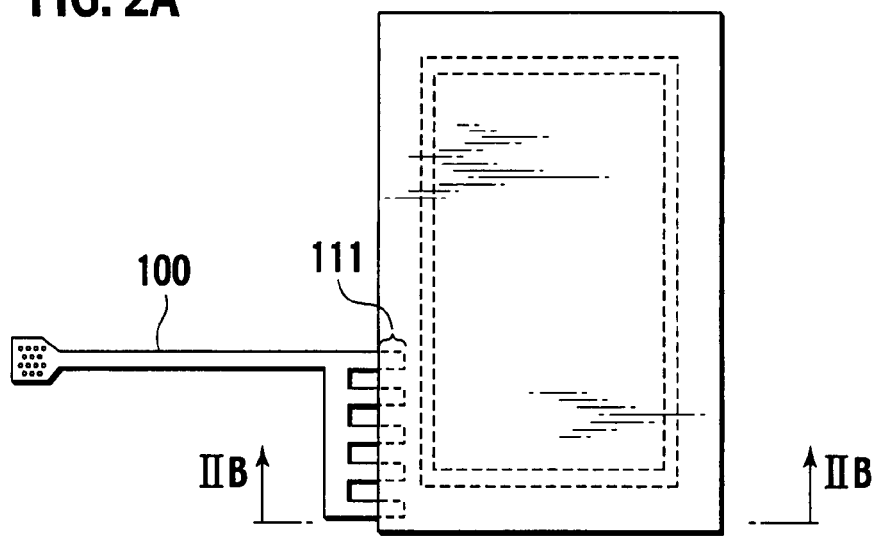
FIGS. 2A and 2B are a top view and a cross-sectional view of a bipolar battery according to the first embodiment, showing a state where unit cells are connected to the wiring board.

Embodiments of a wiring board for battery control, a stacked battery device that incorporates the wiring board, and a vehicle that has the stacked battery device according to the present invention will be explained below in detail with reference to FIGS. 1A to 6. It should be noted that layer thicknesses and shapes of constituent elements, such as the wiring board, of the stacked battery are exaggerated in the drawings to be referred in the embodiments for clarity.

FIGS. 1A to 1C are schematic diagrams of a wiring board formed with a flexible substrate according to a first embodiment of the present invention. FIG. 1A is a top view of the wiring board. FIGS. 1B and 1C are cross-sectional views of the wiring board shown in FIG. 1A taken along lines B-B and C-C, respectively.

As shown in FIG. 1A, the wiring board 100 of a comb-shaped structure has a plurality of teeth (hereinafter, "teeth") 110, a connector 120, and a rod 130 of a required length or longer. Copper, which is a conductor, is exposed at distal ends of the teeth 100. The connector 120 is provided to output a value of a potential across a conductor, which is in contact with copper exposed at the distal ends of the teeth, to the outside. The rod 130 has lead wires. Because the rod 130 is required to extend through and out of a covering member of the battery to allow monitoring of the potential value from the outside, the rod 130 must be of the required length or longer. As shown in FIG. 1B, the wiring board 100 includes five layers: an insulating substrate 141 made of a polyimide; a first adhesive layer 142 made of an insulating adhesive material; a wiring layer 143 made of copper, which is a conductor; a second adhesive layer 144 formed with an insulating adhesive layer; and a covering layer 145 made of a polyimide. The second layer 144 and the covering layer 145 are removed from distal ends 111 of the teeth 110 to expose copper at the surfaces. More specifically, as shown in FIG. 1C, each distal end 111 of the teeth 110 is formed with three layers: the polyimide insulating substrate 141; the first adhesive layer 142 made of the insulating adhesive material; and the wiring layer 143 made of copper, which is a conductor. Meanwhile, because the polyimide insulating substrate 141 is provided all around the wiring board 100, back faces of the teeth 110 are also covered with the polyimide insulating substrate 141. A thickness of the distal ends 111 of the teeth 110 each to be inserted between one of opposing collector foil pairs of the wiring board 100 is required to be smaller than a gap between the opposing collector foil pairs. When the distal ends 111 of the teeth 110, of which thickness is greater than the gap between the opposing collector foil pairs, are inserted between the opposing collector foil pairs, unevenness can develop on surfaces of the collector foils, which can damage a separator or the like during a fixation work and cause short circuit to occur. The unevenness can also cause a sealing member to be squeezed out. Hence, setting the thickness of the distal ends 111 of the teeth 110 smaller than the gap between the opposing collector foil pairs prevent occurrence of short circuit between electrodes of a unit cell, which can otherwise occur in a worst case, thereby improving production yields and reducing manufacturing cost.

The connector 120 on the end of the rod 130 of the wiring board 100 can include a plurality of bumps 121 connected with the plurality of wiring layers 143 via through holes. This configuration of the connector 120 allows to output a potential value across a conductor, which is in contact with the distal ends 111 of the teeth 110 (hereinafter, "teeth distal ends 111") to thus be measured, to the outside of the bipolar battery via the bumps 121. The location of the bumps 121 is not limited to the distal end of the rod 130, and alternatively disposed at a center of the rod 130 or the like. The configuration of the connector 120 as described above allows to monitor output voltage values of the unit cells with a compact configuration that requires a small number of man-hours.

The wiring board 100 can be used to monitor an output voltage value of a unit cell included in a bipolar battery, which is a stacked battery device. More specifically, in a bipolar battery formed by laminating unit cells, each unit cell includes a positive-electrode active-material layer formed on one surface of a collector foil, an ion conductive layer, and a negative-electrode active-material layer formed on the other surface of the collector foil. The teeth 110 of the wiring board 100 are individually inserted between each of the opposing collector foil pairs so that the teeth distal ends 111, at which copper, corresponding to the wiring layer, is exposed, is brought into contact with either one of the opposing collector foil pair, thereby electrically connecting the collector foils with the teeth distal ends 111. Hence, the output voltage of each unit cell can be monitored. The output voltage values of the unit cells are delivered through the plurality of lead wires extending from the distal ends of the teeth 110 of the wiring board 100 to the connector 120 disposed at the end of the rod 130, and hence can be output to the outside. Meanwhile, the back faces of the teeth 110 of the wiring board 100 are covered with the insulating substrate 141 made of a polyimide. Hence, by individually inserting the teeth 110 of the wiring board 100 between each of the opposing collector foil pairs, occurrence of short circuit at the collector foils is prevented.

The wiring board 100 according to the first embodiment is integrally formed with a flexible substrate. Put another way, in contrast with the conventional technique described in Japanese Patent Application Laid-open No. 2005-235428 that performs a function of measuring an output voltage of each of a plurality of unit cells using a plurality types of components, the wiring board 100 can fulfill the same function only with a single component. Thus, data on each unit cell can be monitored with a compact configuration that requires a small number of man-hours, which exerts a significant effect on cost reduction as compared with the conventional technique.

Each unit cell in the wiring board 100 according to the first embodiment can additionally include a discharge circuit element 150 that electrically connects the opposing collector foil pair to each other. The discharge circuit element 150 can be formed with, e.g., a resistor or a Zener diode, and can be hybrid packaged into the wiring board 100. Mounting the discharge circuit element 150 inside the covering member of the bipolar battery eliminates the need of disposing a discharge circuit element at the outside of the covering member, thereby allowing the bipolar battery to be reduced in volume and cost. Components employed in the discharge circuit element 150 can be, e.g., a resistor, a FET, and an IC. A thickness of the wiring board 100, formed with the flexible substrate, at a portion on which these components are mounted can be suppressed to equal to 0.7 mm or smaller, which is smaller than that of the stacked structure of the collector foils in the bipolar battery. When the stacked structure of the collector foils and the wiring board 100 are thus integrally formed, an increase of the bipolar battery in package volume and thickness, which can otherwise be caused by a thick portion on the wiring board 100 where the discharge circuit element 150 is mounted, is prevented. The discharge circuit element 150 is desirably mounted by flip-chip bonding or the like to reduce the mounted portion in thickness. When the discharge circuit element 150 is electrically connected between the opposing collector foil pair of each unit cell in the bipolar battery, the discharge circuit discharges the bipolar battery over a long non-charged period of time, which equalizes the output voltages of the unit cells. Accordingly, recharging of the bipolar battery is to be started in a condition in which the output voltages of the unit cells are equalized, which allows to equalize voltage shares to be taken by the unit cells. Hence, the bipolar battery is protected from being shortened in operable life, which can be caused by an increase in difference among voltage shares. This configuration can also allow, during a charging period of the bipolar battery, to detect violation of a working voltage range by one of the unit cells connected in series. In other words, the configuration can protect the bipolar battery from being shortened in operable life which can occur when a unit cell violates the working voltage range.

When the covering member is stacked under vacuum or the like, the bipolar battery can be exposed to vapors of an electrolytic solution. Accordingly, a chemical-resistant insulating coating is desirably applied on the discharge circuit element 150 mounted on the bipolar battery.

The wiring board 100 according to the first embodiment includes, as described above, the rod 130 of the required length or longer enough to extend through and out of the covering member so that the connector 120 is positioned outside the covering member. Hence, the output voltage values of the unit cells can be delivered to the outside of the bipolar battery.

In contrast therewith, a wiring board according to a second embodiment of the present invention has an antenna mounting portion to wirelessly transmit data on output voltages of the unit cells to the outside. The second embodiment is described later.

Figure 2B:
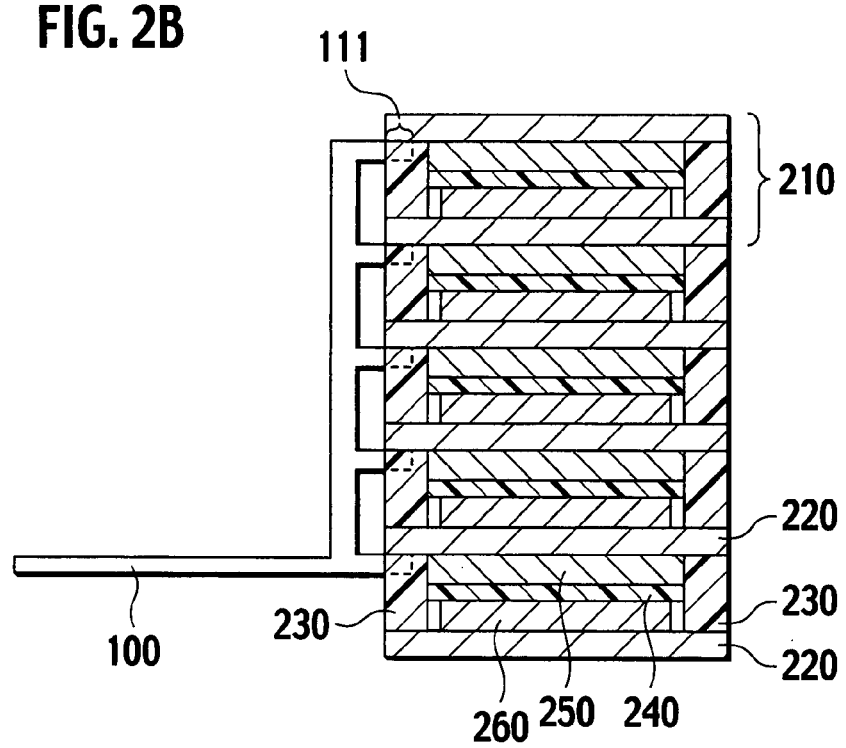

FIGS. 2A and 2B are schematic diagrams of the bipolar battery with unit cells 210 and the wiring board 100 connected to each other. FIG. 2A is a top view of the bipolar battery in which the stacked unit cells 210 and the wiring board 100 are connected to each other. FIG. 2B is a cross-sectional view of the same shown in FIG. 2A taken along a line B-B. Each unit cell 210 includes an ion conductive layer 240, a pair of a positive-electrode active-material layer 250 and a negative-electrode active-material layer 260 that pinches the ion conductive layer 240 therebetween, opposing collector foils 220, and a sealing member 230 that electrically insulates between the opposing pair of the collector foils 220. As shown in FIGS. 2A and 2B, in the first embodiment, the teeth distal ends 111 of the wiring board 100 and the collector foils 220 of each unit cell 210 are joined together, thereby electrically connecting the wiring board 100 to the collector foils 220 of the unit cell 210. The bipolar battery has the sealing member 230 that electrically insulates between the opposing pair of the collector foils 220 on an outer edge of each collector foil 220. Hence, electrical connection between the unit cells 210 and the teeth distal ends 111 of the wiring board 100 can be established using the sealing members 230. The electrical connection between the collector foils 220 of the unit cells 210 and the teeth distal ends 111 of the wiring board 100 are established by performing the following processes. That is, constituent elements of the unit cells 210 are stacked by repeating the following operations for a plurality of times. The sealing member 230 is disposed on the outer edge of one of the collector foils 220. One of the teeth distal ends 111 at which copper, being a conductor of the wiring board 100, is exposed is disposed on the sealing member 230 to face upward. Another collector foil 220 is placed on the distal end 111 to oppose the former collector foil 220. Thereafter, the thus-stacked constituent elements of the unit cells 210 are bonded by thermocompression bonding. The sealing members 230 are adhered to the collector foils 220 by thermal fusing and electrically connected to the same so as to press portions of the teeth distal ends 111, at which the conductor is exposed, against the collector foils 220 of the unit cells 210 while the sealing members 230 remain to surround the teeth distal ends 111 of the wiring board 100 except for their top faces at each of which the conductor is exposed. The sealing member 230 can be made of an elastic material, such as polyethylene oxide (PEO), polyphenylene oxide (PPO), polyvinylidene difluoride (PVDF), an epoxy resin, or a silicone resin. By forming the sealing member 230 with an elastic material, a stress developed due to a difference in thermal expansion coefficient between the collector foils 220 and the teeth distal ends 111 at which copper, which is the conductor of the wiring board 100, is exposed can be absorbed, thereby preventing come off the collector foils 220 that can occur when temperature changes. Accordingly, the failure rate of the bipolar battery can be reduced, and an operable life of the battery package can be lengthened.

Figure 3:
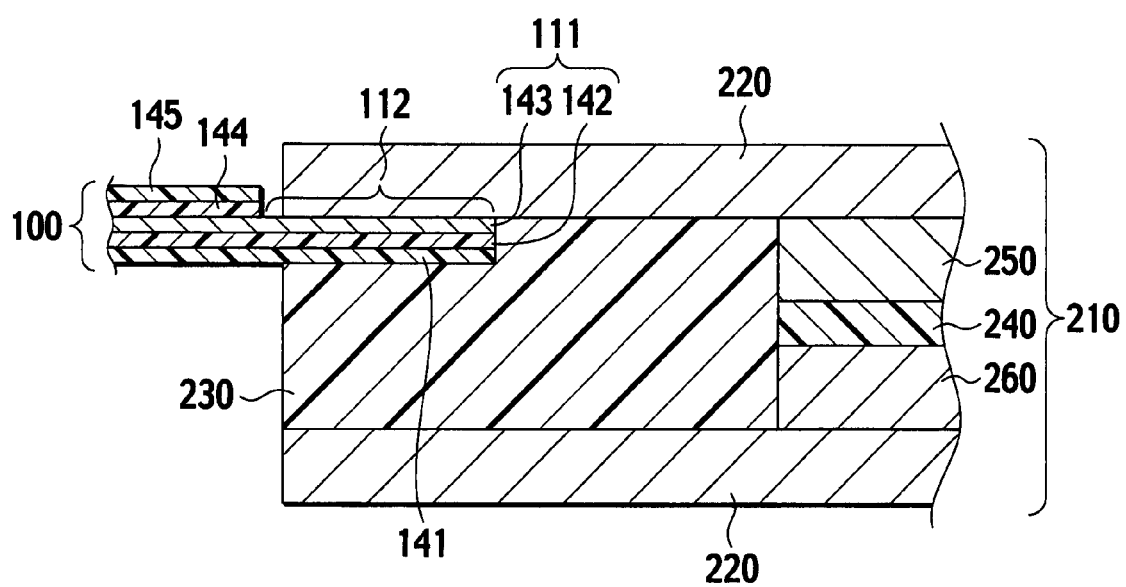
FIG. 3 is a cross-sectional view of a state where a distal end of a tooth of the wiring board of a unit cell in the bipolar battery according to the first embodiment is joined with a collector foil.

FIG. 3 is an enlarged schematic diagram of one of the unit cells 210 of the bipolar battery in which the teeth distal end 111 of the wiring board 100 is connected to the collector foil 220. Copper, which is a conductor, is exposed at a portion of one of the distal ends 111 of the wiring board 100. The portion is inserted between the opposing collector foil pair 220 and joined with one of the collector foils 220 that faces the exposed copper of the tooth distal end 111. As described above, the sealing members 230 can be adhered to the collector foils 220 by thermal fusing and electrically connected to the same so as to press the portions of the teeth distal ends 111, at which the conductor is exposed, against the collector foils 220 of the unit cells 210 while the sealing members 230 remain to surround the teeth distal ends 111 of the wiring board 100 except for their top faces 112 at each of which the conductor is exposed. Alternatively, the teeth distal ends 111 of the wiring board 100 can be adhered to the collector foils 220 using a bonding member such as an anisotropic conductive film (ACF) or an anisotropic conductive adhesive (ACI). When the bonding member is used, the teeth distal ends 111 of the wiring board 100 and the collector foils 220 are bonded securely, thereby reducing the failure rate and improving resistance to vibrations.

As described above, according to the wiring board 100 of the first embodiment, the teeth distal ends 111, at each of which the conductor is exposed, are pressed against the collector foils 220 while the teeth distal ends 111 of the wiring board 100 remain to be surrounded by the sealing members 230 except for the top faces 112 at each of which the conductor is exposed. Hence, the wiring board 100 and the collector foils 220 of the unit cells 210 are electrically connected to each other. Thus, in contrast to the conventional technique described in Japanese Patent Application Laid-open No. 2005-235428, the wiring board 100 according to the present invention does not require a socket that pinches tabs connected with the collector foils of the unit cells 210 to establish electrical connection with the collector foils 220. The present invention thus exerts a significant effect on cost reduction also on this regard, as compared to the conventional technique.

Because the wiring board 100 according to the first embodiment is formed with the flexible substrate and hence exhibits a great resistance against deformation and bending caused by vibrations, the wiring board 100 is less prone to fatigue failure and therefore significantly advantageous in being highly reliable. In the conventional technique, the tabs connected with the collector foils 220 of the unit cells 210 are pinched by the socket to monitor output voltages of the unit cells 210. However, this technique is disadvantageous in being prone to fatigue failure, such as bending and eventually breakage at connecting portions between the socket and the tabs caused by vibrations. Such a problem becomes remarkable when the bipolar battery is disposed at a position constantly subjected to vibrations; more specifically, when the bipolar battery is applied to a vehicle such as an automobile. Hence, the present invention is more advantageous for the bipolar battery applied to a vehicle such as an automobile. The invention is also advantageous in that the teeth of the wiring board 100 is bendable at a great angle during assembly of the stacked structure of the bipolar battery, and reduces a residual stress to be exerted when the teeth of the wiring board 100 are inserted between collector foils of different heights.

Figure 4A:
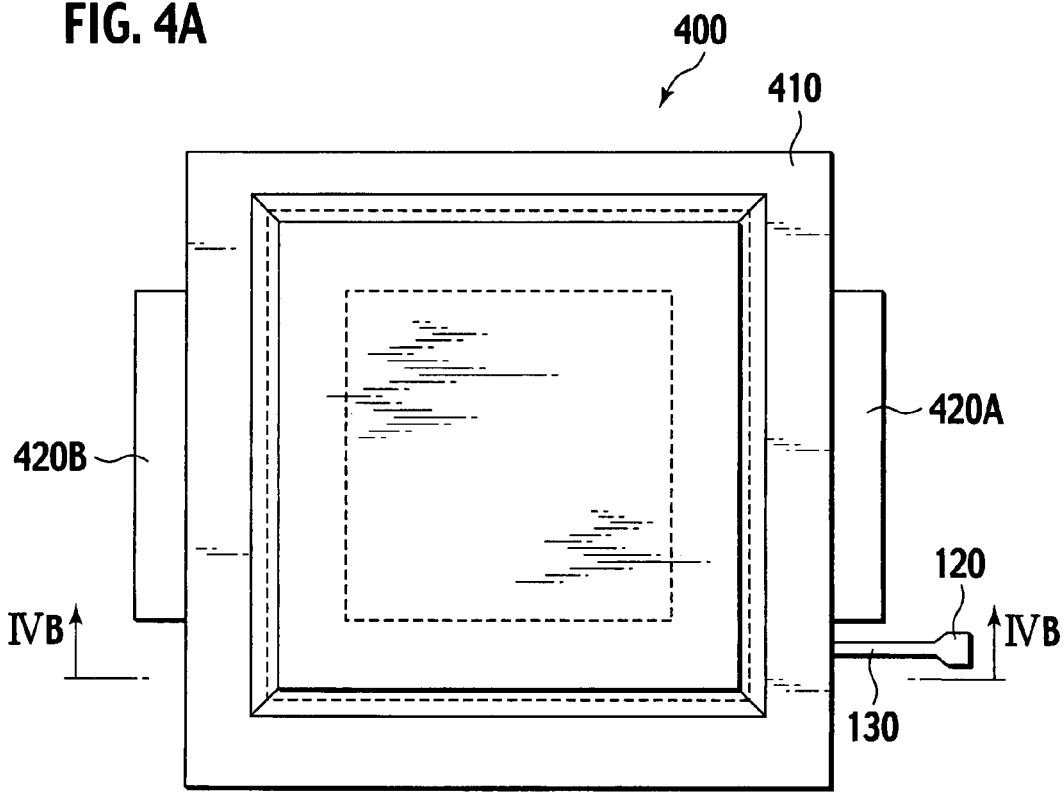
FIGS. 4A and 4B are a top view and a cross-sectional view of a bipolar battery that incorporates the wiring board according to the first embodiment.
Figure 4B:
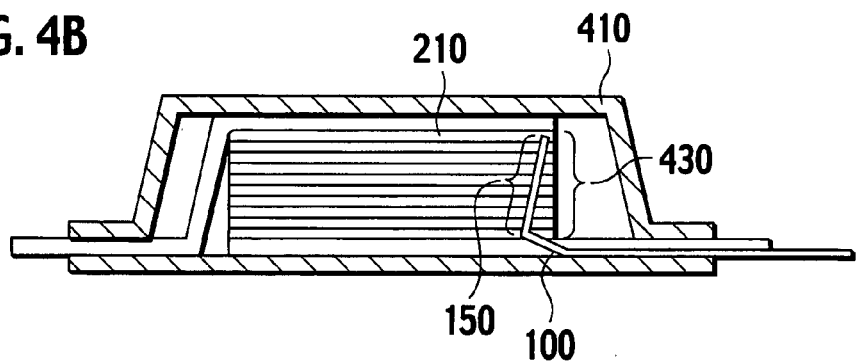

FIGS. 4A and 4B are schematic diagrams of a bipolar battery 400 that incorporates the wiring board 100 therein. FIG. 4A is a top view of the bipolar battery 400. FIG. 4B is a cross-sectional view of the bipolar battery 400 shown in FIG. 4A taken along a line B-B. In the wiring board 100 having a comb-shaped structure, distal ends of the teeth are inserted between an opposing collector foil pair of the unit cells 210 to electrically connect the collector foils with the wiring board 100. Accordingly, teeth 150, as viewed as a set, of the wiring board 100 are inserted while being tilted as required so that the teeth 150 appropriately come into contact with a battery pack 430 to reliably detect voltage values. The battery pack 430 is formed by laminating the unit cells 210 in series. The bipolar battery 400 has a flat shape as shown in the FIGS. 4A and 4B, and includes a positive electrode tab 420A and a negative electrode 420B, via which electric power is taken out, that extend out from opposite sides of the bipolar battery 400. The battery pack 430, which is a laminate of the unit cells 210 connected in series, is covered with a covering member (e.g., a laminating film) 410 of the bipolar 400 and thermally fused on its outer edge. The battery pack 430 is sealed with the rod 130 that has the positive electrode tab 420A, the negative electrode tab 420B, and the connector 120 of the wiring board 100 extending out. The rod 130 having the connector 120 of the wiring board 100 extends out of the covering member 410 to be capable of monitoring output voltages of the unit cells 210 inside the covering member 410 via the connector 120. When the rod 130 is caused to extend out from the covering member 410 in a direction identical with that in which any one of the positive and negative electrode tabs 420A and 420B extends, a mounting area of the bipolar battery 400 can be reduced.

As has been explained with reference to the first embodiment, according to the present invention, the wiring board is made of a flexible material, such as a flexible substrate, to increase resistance against deformation and bending caused by vibration, thereby preventing fatigue failure. The invention also allows to prevent short circuit of the battery, which can occur in a worst case, by employing a simple structure in which an integrally-formed wiring board having a back face made of an insulating member is pinched between an opposing collector foil pair. In other words, the present invention attains high reliability as well as allows to monitor output voltages of unit cells individually. Because the integrally-formed comb-shaped wiring board allows to monitor output voltages of the plurality of unit cells, the present invention exerts a significant cost reduction effect as compared with the conventional technique. In addition, electrical connection between the wiring board and the collector foils of the unit cells by thermally fusing the sealing member to the collector foils, thereby pressing the distal ends of the teeth, at each of which the conductor of the wiring board is exposed, against the collector foils. Hence, a socket, which has been necessary in the conventional technique, for establishing electrical connection with the collector foils is not required. Thus, the present invention exerts a cost reduction effect as compared with the conventional technique.

Figure 5:
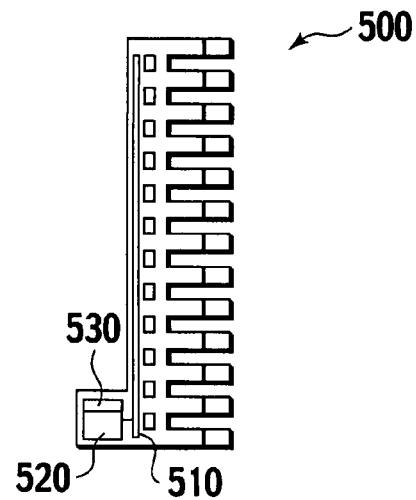
FIG. 5 is a top view a wiring board formed with a flexible substrate according to a second embodiment of the present invention.

The second embodiment is described below. FIG. 5 is a schematic diagram of a wiring board 500 according to the second embodiment. In contrast to the first embodiment, the wiring board 500 according to the second embodiment has an antenna mounting portion to wirelessly transmit output voltage values of the unit cells to the outside. Hence, the wiring board 500 according to the second embodiment does not have a connecter and, in place thereof, has an antenna mounting portion 510, an IC mounting portion 520, and a voltmeter mounting portion 530.

Patterning an antenna is performed on the antenna mounting portion 510. A voltmeter is mounted on the voltmeter mounting portion 530. The IC chip can include an AD converter for converting the output voltages of the unit cells into digital signals, memory for retaining data pertaining to AD conversion, and an antenna drive circuit that drives the antenna in accordance with the data. The data on the unit cells are wirelessly transmitted via the antenna.

The second embodiment differs from the first embodiment in that output voltages of the unit cells are wirelessly transmitted and therefore the wiring board 500 has no connector, but includes the antenna mounting portion, the IC-chip mounting portion, and the voltmeter mounting portion. In other respects, the second embodiment is identical with the first embodiment in configurations and effects, and hence redundant explanations thereof will be omitted.

Figure 6:
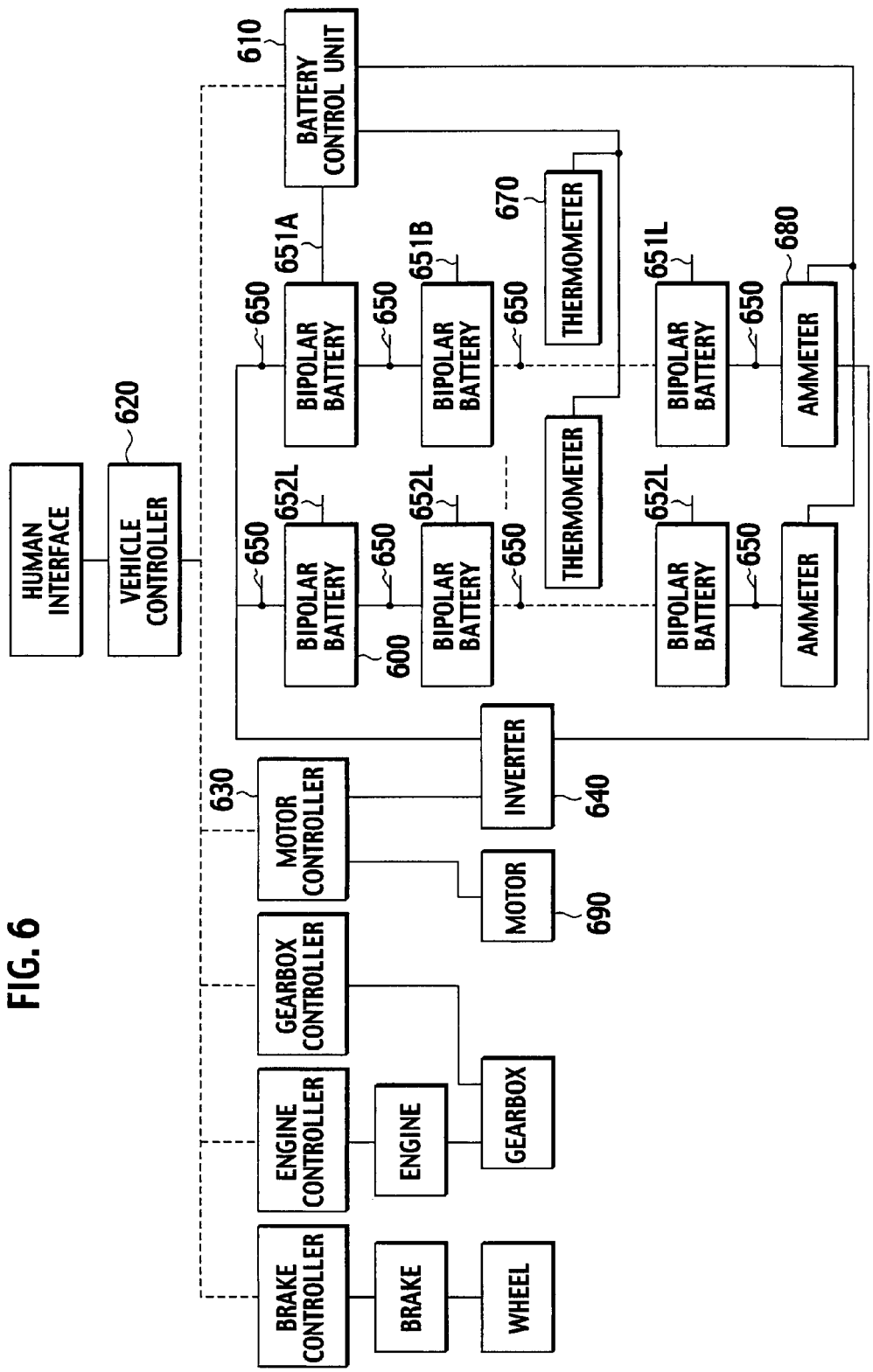
FIG. 6 is a block diagram of automobile control functions to which bipolar batteries each incorporating the wiring board according to the present invention are applied.

FIG. 6 is a block diagram of control functions of an automobile to which bipolar batteries 660 each incorporating the wiring board are actually applied. The plurality of bipolar batteries 660 are connected in series, to which another set of plurality of bipolar batteries 660 connected in series is connected in parallel. The number of the bipolar batteries 660 to be connected in series can be set to an optimal value; e.g., 12, in view of yields.

Solid lines in FIG. 6 indicate electrical connections, whereas dotted lines indicate a network through which data are bi-directionally transmitted. Examples of the network include that through which data on batteries are transmitted to a vehicle controller via an in-vehicle communication system. The wiring boards individually mounted on the bipolar batteries 660 are connected with a battery control unit 610 via connectors 651A to 651L and 652A to 652L. A plurality of thermometers 670 each disposed near a middle one of the bipolar batteries 660 connected in series are also connected with the battery control unit 610. The thermometer 670 is embodied by mounting a temperature sensor on the wiring board.

Figure 8:
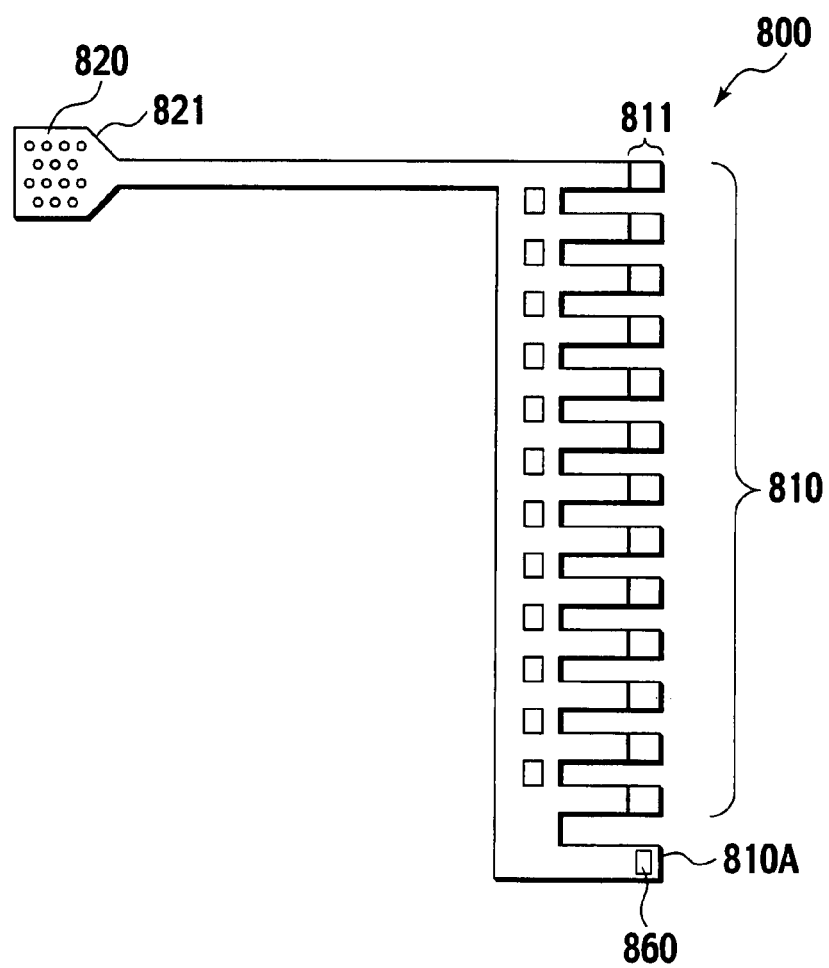
FIG. 8 is a top view of a wiring board formed with a flexible substrate on which a temperature sensor is mounted.

FIG. 8 is a schematic diagram of a wiring board 800 formed with a flexible substrate on which the temperature sensor is mounted. As shown in FIG. 8, the wiring board 800 can include, in addition to a plurality of teeth 810, a tooth 810A with a temperature sensor 860 mounted thereon at its distal end. Copper, being a conductor, is exposed at each of distal ends 811 of the teeth 810. The temperature sensor 860 can be a resistance thermometer of which opposite ends are connected with lead wires in a wiring layer of the wiring board 800 and further connected to a bump 821 on a connecter 820 via the lead wires. Thus, an inter-battery temperature can be measured via the bump 821. As in the case of the plurality of teeth 810, the tooth 810A with the temperature sensor 860 mounted thereon at its distal end is formed with a flexible substrate and can be inserted between any one of opposing collector foil pairs in the bipolar battery. It should be noted that the temperature sensor 860 is not particularly limited to a specific type, and can be a thermocouple.

Returning to FIG. 6, descriptions about the control functions for the automobile to which the bipolar batteries 660 each incorporating the wiring board are actually applied will be continued. An ammeter 680 is disposed on each connecting line, through which the bipolar batteries 660 are connected in series. The ammeter 680 is connected with the battery control unit 610. The battery control unit 610 has functions of monitoring data on output voltages of the unit cells of the bipolar batteries 660, temperatures measured by the thermometers 670, and current values measured by the ammeters 680, and outputting result of monitoring to a vehicle controller 620.

The vehicle controller 620, including a motor controller 630 and the like, has a function of controlling the entire vehicle. An inverter 640 charges or discharges the bipolar batteries 660 in response to a signal supplied from the motor controller 630. The vehicle controller 620 determines conditions of the unit cells in each bipolar battery 660 and performs control to cause each unit cell to return to a middle of a working voltage range before deviating from the working voltage range. Accordingly, the vehicle controller 620 monitors each unit cell of each bipolar battery 660 and controls the inverter 640 based on a result of the monitoring to charge and discharge the bipolar battery 660. The conditions of the bipolar batteries 660 are also utilized in control of loads, such as a motor 690, on the bipolar batteries 660. Hence, the vehicle can be operated within the working voltage range or a recommended voltage range of the bipolar batteries 660.

Figure 7:
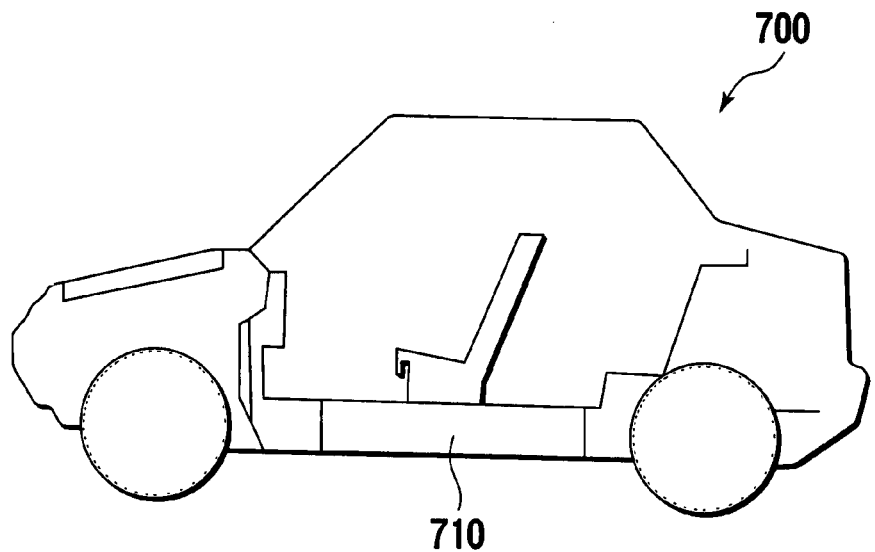
FIG. 7 is a view of an electric vehicle on which the bipolar battery that incorporates the wiring board according to the present invention is mounted.

As shown in FIG. 7, the bipolar battery that incorporates the wiring board according to the present invention can be mounted on an electric vehicle 700 under its seat 710 at the center of a vehicle body. When the bipolar battery is mounted under the seat, a large space can be secured for a compartment and a trunk room, which is advantageous. The location of the bipolar battery is not limited to a position under the seat, and can be disposed below the rear trunk room or an engine room on the front of the vehicle.

EXAMPLE

The wiring board according to the present invention can be formed with a flexible substrate. Meanwhile, the tabs included in each unit cell for use in voltage monitoring have conventionally been formed with copper foils. To evaluate resistance of the wiring board according to the invention against deformation and bending caused by vibrations, an IPC bending test was conducted.

Figure 9A:
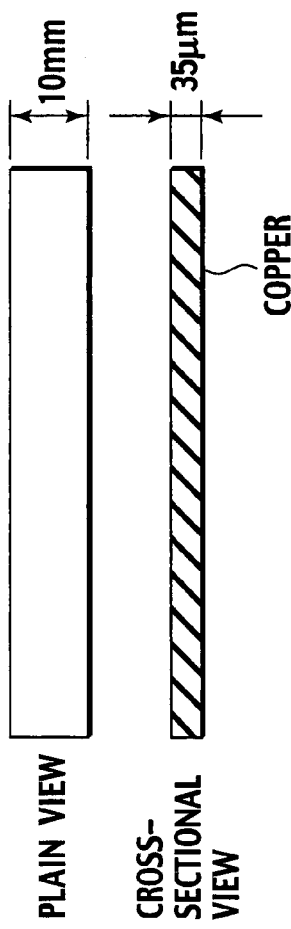
FIG. 9A is a plan view and a cross-sectional view of a copper foil subjected to an IPC bending test.
Figure 9B:
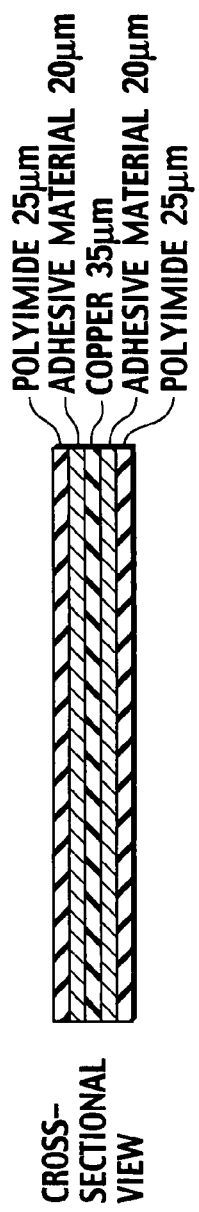
FIG. 9B is a cross-sectional view of a flexible substrate subjected to the IPC bending test.

FIGS. 9A and 9B show specimens subjected to the IPC bending test. FIG. 9A shows a plan view and a cross-sectional view of a copper foil representing a conventional tab for use in voltage monitoring. FIG. 9B is a cross-sectional view of a flexible substrate representing the wiring board according to the present invention. In the IPC bending test, the specimens were subjected to vibrations with a bend radius R of 3 mm. The copper foil representing the conventional voltage monitoring tab was broken after approximately 8,000 vibrations. On the other hand, the flexible substrate representing the wiring board according to the invention was broken after approximately two billion vibrations. It is apparent from the results that the flexible substrate representing the wiring board according to the invention is 250,000 times more resistant against deformation and bending caused by vibrations than the copper foil representing the conventional voltage monitoring tab.

While the case that the bipolar battery that incorporates the wiring board according to the present invention is used as a power source for an automobile has been explained above, the applicability of the invention is not limited thereto. The present invention can be modified or changed by persons skilled in the art pertinent thereto, without departing from the spirit or scope of the invention.

According to the present invention, the wiring board integrally formed with a flexible substrate allows to monitor each of output voltages of a plurality of unit cells, which are constituent elements of the stacked battery device, while attaining high reliability.

Description has been made of the embodiments to which the invention created by the inventors of the present invention is applied. However, the present invention is not limited to the descriptions and the drawings, which form a part of the disclosure of the present invention according to these embodiments. Specifically, all of other embodiments, examples, operational techniques and the like, which are made by those skilled in the art based on these embodiments, are naturally incorporated in the scope of the present invention. The above is additionally described at the end of this specification.

The entire content of Japanese Patent Application No. TOKUGAN 2006-318779 with a filing date of Nov. 27, 2006, and Japanese Patent Application No. TOKUGAN 2007-169562 with a filing date of Jun. 27, 2007, is hereby incorporated by reference.

What is claimed is:

1. A stacked battery device comprising:
a plurality of opposing collector foil pairs through which a plurality of secondary cells are stacked and connected in series;
a comb-shaped wiring board that has a plurality of teeth individually inserted between each of the opposing collector foil pairs and electrically connected with either one of the opposing collector foil pair, and a rod supporting the plurality of teeth and provided with an output end through which potential values at the plurality of teeth are output; and
sealing members individually interposed between each of the opposing collector foil pairs to electrically insulate members of each of the collector foil pairs from each other,
wherein the comb-shaped wiring board includes:
a comb-shaped insulating substrate, wherein the plurality of teeth and the rod supporting the plurality of teeth are formed from the comb-shaped insulating substrate, and
a wiring layer formed on the insulating substrate,
wherein the wiring layer has a plurality of lead wires each individually extending from a distal end of each of the plurality of teeth to an end of the rod to deliver currents of voltages across the ones of the collector foil pairs, which are in contact with the distal ends of the plurality of teeth, and
wherein the sealing members cause the distal ends of the plurality of teeth to be joined to the respective ones of the respective collector foil pairs while surrounding the distal ends of the plurality of teeth except for portions at each of which the respective one of the respective collector foil pair is provided, thereby bringing the plurality of teeth into contact with the respective ones of the respective collector foil pairs to establish electrical connections therebetween.

2. The stacked battery device according to claim 1, wherein the wiring board includes a discharge circuit mounted on the wiring board and capable of electrically connecting between the opposing collector foil pairs.

3. The stacked battery device according to claim 1, wherein a thickness of each tooth of the comb-shaped wiring board is smaller than a gap between the opposing collector foil pairs.

4. The stacked battery device according to claim 1, further comprising a covering member, wherein the rod of the comb-shaped wiring board extends through a sealing portion of the covering member to an outside of the covering member.

5. The stacked battery device according to claim 1, wherein the wiring board is connected to a controller outside of the battery device to thus be controlled by the controller.

6. The stacked battery device according to claim 1, wherein the wiring board is flexible.

7. A vehicle having the stacked battery device according to claim 1, wherein the stacked battery device has a function of supplying and receiving electric power to and from a motor of the vehicle; and
wherein an outside controller connected to the wiring hoard transmits data on output voltages of cells to a vehicle controller via an in-vehicle communication system.

8. The stacked battery device according to claim 1, wherein the plurality of teeth individually inserted between each of the opposing collector foil pairs are directly electrically connected to their respective one of their respective collector foil pair.

9. The stacked battery device according to claim 2, wherein a portion of the wiring board at which the discharge circuit is disposed is less thick than a stacked structure of the collector foils electrically connected to the wiring board.

10. A stacked battery device comprising:
a plurality of opposing collector foil pairs through which a plurality of secondary cells are stacked and connected in series; and
a comb-shared wiring board that has a plurality of teeth individually inserted between each of the opposing collector foil pairs and electrically connected with either one of the opposing collector foil pair, and a rod supporting the plurality of teeth and provided with an out rut end through which potential values at the plurality of teeth are output,
wherein the comb-shaped wiring board includes:
a comb-shaped insulating substrate, wherein the plurality of teeth and the rod supporting the plurality of teeth are formed from the comb-shaped insulating substrate; and
a wiring layer formed on the insulating substrate, wherein the wiring layer has a plurality of lead wires each individually extending from a distal end of each of the plurality of teeth to an end of the rod to deliver currents of voltages across the ones of the collector foil pairs, which are in contact with the distal ends of the plurality of teeth,
wherein a thickness of each tooth of the comb-shaped wiring hoard is smaller than a gap between the opposing collector foil pairs, and
wherein each tooth of the comb-shaped wiring board is surrounded by an elastic member except for a contacting face on the tooth that contacts its respective one of its respective collector foil pair.

11. The stacked battery device according to claim 10, wherein the plurality of teeth individually inserted between each of the opposing collector foil pairs are directly electrically connected with their respective one member of their respective opposing collector foil pair.

* * * * *